United States Patent [19]

Pelgrom et al.

[11] Patent Number: 4,987,580

[45] Date of Patent: Jan. 22, 1991

[54] CHARGE TRANSFER DEVICE HAVING CAPACITIVE FEEDBACK

[75] Inventors: Marcellinus J. M. Pelgrom, Eindhoven; Antonius J. G. Jochijms, Sevenum; Arthur H. M. Van Roermund, Eindhoven, all of Netherlands

[73] Assignee: U.S. Philips Corp., New York, N.Y.

[21] Appl. No.: 209,444

[22] Filed: Jun. 20, 1988

[30] Foreign Application Priority Data

Jun. 30, 1987 [NL] Netherlands ............... 8701528

[51] Int. Cl.⁵ .................. G11C 27/02; H01L 29/78
[52] U.S. Cl. ............................. 377/60; 377/58; 377/59; 307/501; 307/494; 357/24
[58] Field of Search ..................... 377/57–63; 357/24, 51; 307/491, 494, 530, 362, 607; 330/253, 260; 328/128; 333/165

[56] References Cited

U.S. PATENT DOCUMENTS

| | | | |
|---|---|---|---|
| 3,969,636 | 7/1976 | Baertsch et al. | 377/58 |
| 4,074,206 | 2/1978 | Horninger | 377/60 |
| 4,139,784 | 2/1979 | Sauer | 377/60 |
| 4,156,818 | 5/1979 | Collins et al. | 377/60 |
| 4,255,673 | 3/1981 | Knauer | 377/58 |
| 4,528,684 | 7/1985 | Iida et al. | 377/60 |
| 4,809,307 | 2/1989 | Sakaue et al. | 377/60 |
| 4,812,887 | 3/1989 | Boudewijns | 377/58 |
| 4,872,043 | 10/1989 | Fujii | 377/58 |

FOREIGN PATENT DOCUMENTS 0046549  3/1982  European Pat. Off. .

Primary Examiner—Stanley D. Miller
Assistant Examiner—Tai V. Duong
Attorney, Agent, or Firm—Steven R. Biren

[57] ABSTRACT

The invention relates to a semiconductor device including a charge transfer device having an output stage (8). The output stage (8) has a read-out zone (9), a feedback capacitor (11) and an amplifier (10). An inverting input (15) of the amplifier (10) is connected to the read-out zone (9) and an output (16) of the amplifier (10) is fed back via the feedback capacitor (11) to the inverting input (15). According to the invention, the capacitor (11) is a capacitor of the MOS type and means are provided by which during operation of the charge transfer device the surface potential of a surface region (13) in the capacitor (11) is solely determined by the potential of the read-out zone (9). Consequently, the capacitance of the feedback capacitor (11) is dependent upon the potential across it, as a result of which there is a linear relation between the charge supplied to the read-out zone (9) and the voltage variation across the capacitor (11). Thus, this voltage variation is an accurate measure of the supplied charge.

8 Claims, 2 Drawing Sheets

CHARGE TRANSFER DEVICE HAVING CAPACITIVE FEEDBACK

BACKGROUND OF THE INVENTION

The invention relates to a semiconductor device comprising a semiconductor body provided at a surface with a charge transfer device having an output stage, which comprises a read-out zone located at the surface and an amplifier having a feedback capacitor, an inverting input of the amplifier being connected to the read-out zone and an output of the amplifier being fed back through the capacitor to the input.

Such a semiconductor device is known from European Patent Application laid open to public inspection under No. 46,549. In the known device, a charge packet reaching the read-out zone is supplied to the feedback capacitor, as a result of which the voltage across the feedback capacitor varies. This voltage variation is a measure for the supplied quantity of charge. In analogous applications, a linear relation should exist between the quantity of supplied charge and the voltage variation across the capacitor in order to be able to determine in a simple manner the quantity of supplied charge from the voltage variation. For this purpose it is required that the capacitor has a voltage-independent capacitance. According to the said Application, a capacitor of the MOS type is not particularly suitable to this end because its capacitance depends upon the voltage across the capacitor.

Further, in general a capacitor can be formed in a semiconductor device by using a cut-off pn junction or two conductive layers between which a dielectric layer is disposed. Besides these capacitors integrated in the semiconductor device, a non-integrated capacitor may also be used. However, all these alternatives have disadvantages. For example, the capacitance of a cut-off junction is voltage-dependent, as a result of which the relation between the quantity of charge at the capacitor and the voltage read out across it is non-linear. The manufacture of the capacitor comprising two conductive layers and an intermediate dielectric layer often does not fit into existing processes and consequently would involve in many cases additional processing steps. The non-integrated capacitor has the disadvantage that it is comparatively expensive and moreover requires additional contact surfaces in the semiconductor device and in connection therewith additional connecting pins in the envelope.

SUMMARY OF THE INVENTION

The invention has for its object to provide a semiconductor device of the kind mentioned above having a feedback capacitor which is integrated in the semiconductor device, preferably does not occupy additional space therein, is compatible with the manufacturing process of the semiconductor device and moreover has a practically voltage-independent capacitance.

For this purpose, a semiconductor device of the kind mentioned above is characterized according to the invention in that the capacitor has a surface region in the semiconductor body, a dielectric layer on the surface and an electrically conducting layer on the dielectric layer, in that the surface region is connected to the read-out zone and in that means are provided by which during operation of the charge transfer device the surface potential of the surface region of the feedback capacitor is solely determined by the potential of the read-out zone. During operation of the device, the potential of the read-out zone has a substantially constant value. In fact, when charge is supplied to the read-out zone, this charge will be substantially entirely stored on the conductive layer of the feedback capacitor in the case of a sufficiently high voltage amplification of the amplifier. The fraction of charge left is so small that the potential of the read-out zone substantially does not vary thereby. Since in the semiconductor device according to the invention, it is achieved by the means that the surface potential of the surface region is solely determined by the potential of the read-out zone, this means that the capacitance of the feedback capacitor is substantially voltage-independent. The voltage across the feedback capacitor varies, however, as a result of the supplied charge. Since in the semiconductor device according to the invention the capacitance of the feedback capacitor is substantially voltage-independent, it holds for the voltage variation across it that: $\Delta V = \Delta Q/C_f$, where $\Delta V$ is the voltage variation, $\Delta Q$ is the supplied quantity of charge and $C_f$ is the capacitance of the feedback capacitor. By the supply of a quantity of charge at the read-out zone, the voltage across the feedback capacitor therefore varies by a proportionate amount. This voltage variation is thus an accurate measure for the quantity of supplied charge.

The said means may be of various kinds, such as, for example, a voltage source between the output of the amplifier and the feedback capacitor. A particular embodiment of the semiconductor device, in which the means are present in the feedback capacitor itself, is characterized in that the feedback capacitor is of the depletion type. In such a capacitor, an inversion channel of a conductivity type opposite to the conductivity type of the surface region is present at the surface below the dielectric layer. This channel may be obtained, for example, as a result of properties of the material of the dielectric and/or conductive layers. In general a depletion region is present below the inversion channel. This means that the feedback capacitor can be assumed to be composed in this case of two parallel-connected capacitances, i.e. in the first place the capacitance of the conductive layer and the inversion channel with the interposed dielectric layer and in the second place the capacitance of the inversion channel and the surface region with the interposed depletion region. The first capacitance is then voltage-independent, but the second capacitance is voltage-dependent. However, due to the fact that the potential of the inversion channel is equal to the potential of the read-out zone and the latter substantially does not vary, the potential difference across the depletion region is substantially constant, as a result of which the second capacitance does not vary during operation of the device. If the charge supplied to the read-out zone is conducted to the conductive channel, the voltage across the feedback capacitor will therefore vary directly proportionally so that this voltage variation can serve as an accurate measure for the quantity of charge supplied to the read-out zone.

A further particular embodiment of the semiconductor device according to the invention is characterized in that the feedback capacitor has in the surface region at the surface a doped zone of a conductivity type opposite to a conductive type of the surface region. This doped zone can be provided both by implantation and by diffusion. Due to the presence of the doped zone, no special requirements need be imposed on the material of the dielectric and/or conductive layers to form at the surface a conductive channel as described above.

Preferably, according to the invention, the doped zone adjoins the read-out zone. In order to conduct the charge supplied to the read-out zone to the doped zone, no additional contacts and connections need be provided, while in this manner moreover substantially no additional space is required.

A preferred embodiment of the semiconductor device is characterized according to the invention in that the amplifier comprises a field effect transistor, of which a drain zone constitutes the output of the amplifier and is coupled to a load and of which a gate electrode constitutes the inverting input of the amplifier, and in that a reset transistor is arranged between the output of the amplifier and the read-out zone. By means of the reset transistor, the read-out zone is biased at a given voltage during operation. In general, a comparatively high voltage should be chosen for this purpose because, when charge is supplied to the read-out zone, the potential thereof varies comparatively strongly. In practice, the supply voltage is generally chosen for this purpose. During operation of the charge transfer device, the supply voltage slightly fluctuates, however, and these fluctuations are passed on to the output of the amplifier so that no pure signal is measured there. As already stated, the potential of the read-out zone in the semiconductor device according to the invention varies only very slightly when charge is supplied to the read-out zone. As a result, it is not necessary to bias the read-out zone beforehand at a high voltage, but it is possible to choose for this purpose a comparatively low voltage. In the preferred embodiment described above, the read-out zone is biased at substantially the threshold voltage of the field effect transistor by means of the reset transistor. This voltage is a very constant voltage which only depends upon configurational properties of the transistor and does not vary during operation of the transistor. As a result, a pure signal can be measured at the output of the amplifier, which signal is not influenced by fluctuations in the supply voltage.

A particular preferred embodiment of the semiconductor device is characterized according to the invention in that the charge transfer device is provided with an input having an input capacitor, which comprises a dielectric layer on the semiconductor body and a conductive layer on the dielectric layer, and in that the dielectric layer of the input capacitor has at least substantially the same structure as the dielectric layer of the feedback capacitor. The term "structure" is to be understood herein to mean both the composition and the thickness of the dielectric layer. In practice this means that the dielectric layer of the input capacitor and that of the feedback capacitor are manufactured in the same technological step. Due to the fact that both dielectric layers practically have the same structure, the capacitive properties of both layers are also the same. As a result, the amplification factor of the charge transfer device depends only upon the ratio between the surface area of the input capacitor and that of the output capacitor. When suitable values are chosen for both surface areas, the amplification factor of the device can thus be adjusted in an accurate and simple manner. Thus, it is possible, for example, if the charge transfer device is included in a circuit having an amplification factor $\beta$, to simply choose the surface areas of the input capacitor and the feedback capacitor in such a manner that their ratio is equal to $\alpha = 1/\beta$, as a result of which the overall amplification factor of the circuit is equal to unity and therefore its output signal is an exact reproduction of the input signal. Moreover, the amplification factor is very accurately reproducible now that the specific common structure of both dielectric layers is no longer of importance.

BRIEF DESCRIPTION OF THE DRAWING

The invention will now be described more fully with reference to the drawing and several embodiments. In the drawing.

Figure 1:
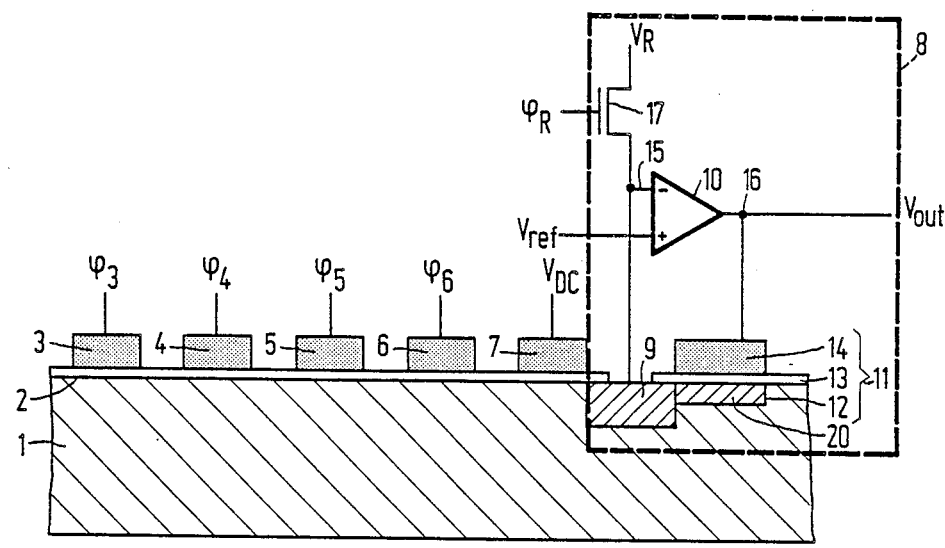
FIG. 1 shows diagrammatically in cross-section an embodiment of the semiconductor device according to the invention.

The Figures are schematic and not drawn to scale. In particular, some dimensions are greatly exaggerated for the sake of clarity. Corresponding parts are generally designated by the same reference numerals. Further, semiconductor material of the same conductivity type is generally cross-hatched in cross-section in the same direction.

DESCRIPTION OF THE PREFERRED EMBODIMENTS

FIG. 1 shows in cross-section an embodiment of a semiconductor device according to the invention. The semiconductor device comprises a semiconductor body 1, in this embodiment of p-type monocrystalline silicon, which is provided at a surface 2 with a charge transfer device. In this embodiment, the charge transfer device is an n-channel surface charge transfer device, but other kinds of charge transfer devices, such as, for example, a buried channel CCD, a peristaltic CCD or a BBD, are also possible without departing from the scope of the invention. The charge transfer device comprises a number of clock electrodes 3 to 6 and an output gate 7 and is further provided with an output stage 8. The output stage 8 comprises a read-out zone 9 located at the surface 2 and an amplifier 10 having a feedback capacitor 11. In this embodiment, an operational amplifier is chosen, but another kind of amplifier is conceivable within the scope of the invention. According to the invention, the feedback capacitor 11 comprises a surface region 12 in the semiconductor body, a dielectric layer 13 on the surface 2 and a conductive layer 14 on the dielectric layer 13. In this embodiment, the dielectric layer 13 is a layer of silicon oxide and the conductive layer 14 is a layer of doped polycrystalline silicon. The invention is not limited to these materials, however, so that within the scope of the invention any dielectric material may be used for the dielectric layer and any electrically conducting material may be used for the conductive layer. The amplifier 10 has an inverting input 15, which is connected to the read-out zone 9. The output 16 of the amplifier 10 is fed back via the feedback capacitor 11 to the inverting input 15. Further, the output stage 8 comprises a reset transistor 17, which is connected to the read-out zone 9 in order to bias the latter at a given fixed potential $V_R$. In the drawing, the reset transistor 17 is shown, like the amplifier 10, only for the sake of clarity beside the semiconductor device 1, but they may both be integrated without further expedients in the semiconductor body 1, which will be the case in practice.

During operation of the charge transfer device, suitably chosen clock voltages $\phi_3$ to $\phi_6$ are supplied to the clock electrodes 3 to 6 in order to displace a charge packet, in this embodiment a number of electrons, towards the output gate 7. The output gate 7 is then kept at a constant potential $V_{DC}$ in order to counteract cross-talk between the last clock electrode 6 and the read-out zone 9. After the charge packet has arrived below the last clock electrode 6, it will entirely be supplied to the read-out zone 9 due to a potential difference between the clock electrode 6 and the output gate 7 and a potential difference between the output gate 7 and the biased read-out zone 9.

The read-out zone 9 is connected to the inverting input 15 of the amplifier 10. With a sufficiently high voltage amplification $\mu$ of the amplifier 10, for example $\mu > 40$, the supplied electrons will be stored substantially all on the feedback capacitor 11. The fraction of electrons left in the read-out zone 9 is so small that consequently the variation dV of its potential is very small.

The potential across the feedback capacitor 11 varies considerably, however. Due to the voltage amplification $\mu$ of the amplifier 10, the potential of the conductive layer 13 increases by an amount $\mu \cdot dV$ as a result of the electrons supplied. This voltage variation in a MOS capacitor, such as for example the clock electrodes 3 to 6, is generally not directly proportional to the quantity of supplied electrons due to the fact that the capacitance of such a capacitor essentially depends upon the voltage across it. This will be explained more fully with reference to FIG. 2.

Figure 2:
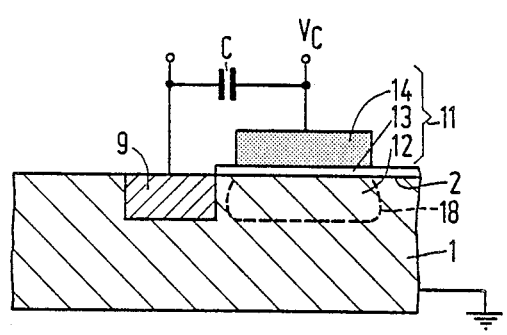
FIG. 2 shows diagrammatically in cross-section an MOS-capacitor.
Figure 3:
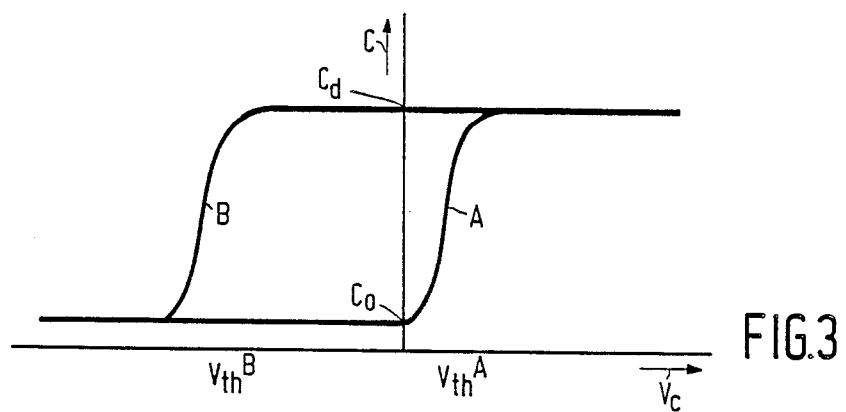
FIG. 3 shows a graph of the relation between the capacitance of, and the voltage across an MOS capacitor.

FIG. 2 shows a semiconductor body 1 of p-type monocrystalline silicon and therein an n-type zone 9 as well as a capacitor 11 of the type described above. The capacitor 11 comprises a surface region 12 in the semiconductor body 1, a dielectric layer 13 located above the surface region 12 on a surface 2 of the semiconductor body and a conductive layer 14 located on the dielectric layer. In this embodiment, the semiconductor body 1 is connected to ground. If a positive potential is applied to the conductive layer 14, a part 18 of the p-type surface region 12 will be depleted below the surface 2. The capacitance of the feedback capacitor 11 also depends upon the size of this depletion region 18. The capacitance of the capacitor 11 is always understood to mean herein the capacitance measured between the read-out zone 9 and the conductive layer 14 of the capacitor 11, which is indicated in FIG. 2 by $C_t$. At a negative or very low value of the voltage of the conductive layer 14, the surface region 12 will not or substantially not be depleted and the capacitance is mainly determined by an overlap capacitance $C_o$ between the conductive layer 14 and the read-out zone 9. If the potential of the conductive layer 14 increases, the surface potential of the surface region 12 will also increase, as a result of which the surface region 12 becomes depleted or, if this were already the case, the depletion region extends more deeply into the surface region 12. Consequently, the capacitance of the capacitor 11 assumes a higher value until the threshold voltage of the capacitor is reached. Above the threshold voltage, the capacitor passes to the state of inversion, which means that below the surface 2 a channel of a conductivity type opposite to that of the surface region 12, in this case an n-type channel, is formed in the surface region 12. A conductive connection is then obtained between the read-out zone 9 and the surface region 12 and the capacitance $C_t$ is equal to the capacitance $C_d$ across the dielectric layer 13. This variation is shown diagrammatically in FIG. 3 by the curve A, where $V_{th}{}^A$ represents the threshold voltage of the capacitor 11.

In analogous applications, it is of importance that there is a linear relation between the supplied quantity of charge to the feedback capacitor 11 and the voltage variation across it. Only in this case, the quantity of charge supplied to the read-out zone 9 can be accurately determined in a simple manner from the voltage variation across the feedback capacitor 11.

In order to achieve this, according to the invention, the surface region 12 is connected to the read-out zone 9 and means are provided by which during operation of the charge transfer device the surface potential of the surface region 12 is solely determined by the potential of the read-out zone 9. The means may be of many kinds, such as, for example, a voltage source between the output of the amplifier 10 and the conductive layer 14 of the feedback capacitor 11 and an inversion channel below the surface 2. In FIG. 1, the means comprise an n-type doped zone 20 located in the surface region 12 and adjoining the surface 2 and the read-out zone 9. The doped zone 20 can be obtained both by implantation and by diffusion. Moreover, it is possible that the read-out zone 9 serves at the same time as a doped zone. In this case, the dielectric layer 13 and the conductive layer 14 are located above the read-out zone. An advantage of a doped zone 20 is that no special requirements need be imposed on the material of the conductive layer 14 and/or the dielectric layer 13 to form at the surface a conductive channel. As already stated above, during operation of the charge transfer device the read-out zone 9 has a substantially constant potential. By this means it is achieved that the surface potential of the surface region 12 is also substantially constant and the capacitance of the feedback capacitor 11 is substantially voltage-independent. This is indicated diagrammatically in FIG. 3 by the curve B, where $V_{th}{}^B$ is the threshold voltage of the feedback capacitor 11 according to the invention. By the doped zone 20 it is achieved that the threshold voltage is reduced to below 0 V, as a result of which with normal operating voltages at the capacitor the capacitance is always equal to the capacitance $C_d$ across the dielectric layer 13. Consequently, for the voltage variation $\Delta V$ across the feedback capacitor 11 due to the quantity of charge $\Delta Q$ supplied to the read-out zone 9 the following linear relation holds: $\Delta V = \Delta Q / C_d$. The capacitance $C_d$ across the dielectric layer 13 is not dependent upon the voltage V across the capacitor. Due to the supply of charge to the read-out zone 9, the voltage across the feedback capacitor 11 therefore varies by a proportionate amount. Thus, in the semiconductor device according to the invention the voltage variation across the feedback capacitor 11 is an accurate measure for the quantity of charge supplied to the read-out zone 9.

Figure 4:
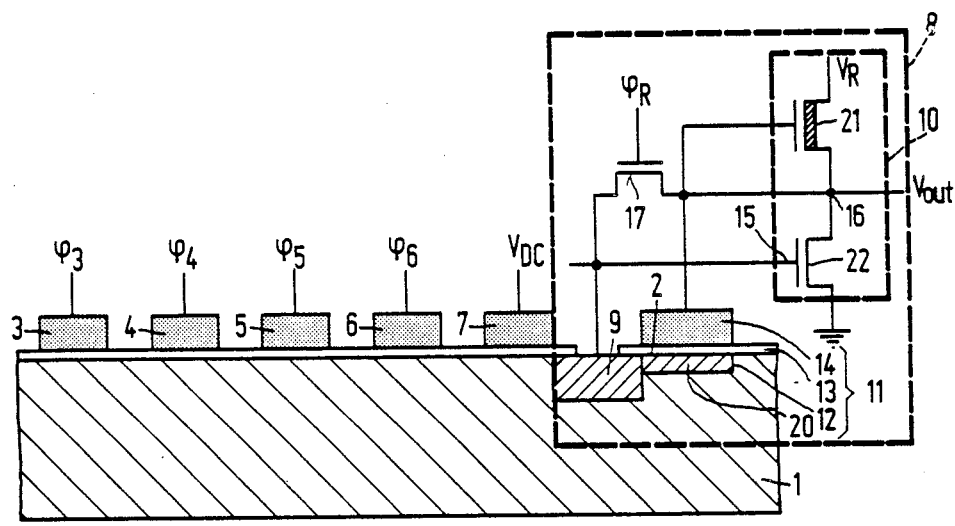
FIG. 4 shows diagrammatically and in cross-section a preferred embodiment of a semiconductor device according to the invention.

FIG. 4 shows diagrammatically in cross-section a preferred embodiment of the semiconductor device according to the invention. In this semiconductor device, according to the invention the amplifier 10 comprises a field effect transistor 22, of which a drain zone constitutes the output 16 of the amplifier 10 and is coupled to a load 21. In this embodiment, the load 21 is a field effect transistor of the depletion type, but it could also be an ohmic resistor. A gate electrode 15 of the field effect transistor 22 is the inverting input of the amplifier 10. A reset transistor 17 is arranged between the output 16 of the amplifier 10 and the read-out zone 9 to bias thereby the read-out zone 9 at a given voltage. In general a comparatively high voltage should be chosen for this purpose because by the supply of charge to the read-out zone 9 the potential thereof varies comparatively strongly. In practice the supply voltage is mostly chosen to this end. During operation of the semiconductor device, the supply voltage slightly fluctuates, however. These fluctuations are passed on to the output 16 of the amplifier 10 and distort the output signal. As already stated, the potential of the read-out zone 9 in the semiconductor device according to the invention varies only very slightly when charge is supplied to the read-out zone 9. As a result, it is not necessary to bias the read-out zone beforehand at a high voltage, but it is possible to choose for this purpose a comparatively low voltage. In the preferred embodiment described above, by means of the reset transistor the read-out zone is biased at substantially the threshold voltage of the field effect transistor 22. This voltage is a very constant voltage, which only depends upon configurational properties of the transistor 22 and does not vary during operation of the semiconductor device. Thus, a pure signal is measured at the output 16 of the amplifier 10.

Figure 5:
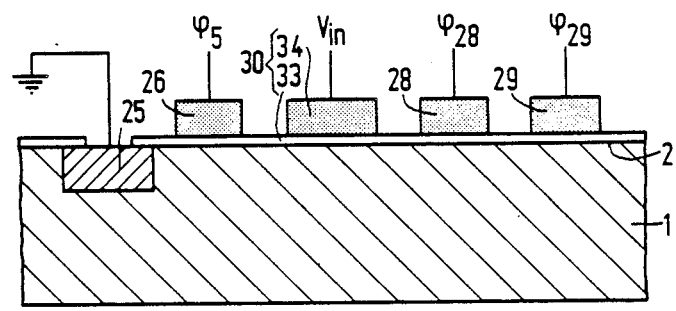
FIG. 5 shows diagrammatically and in cross-section an input stage of the semiconductor device according to the invention.

FIG. 5 shows an input stage of the charge transfer device in the semiconductor device according to the invention. The input stage comprises a read-in zone 25, a sample gate 26 and an input capacitor 30. An input signal $V_{in}$ is supplied to the input capacitor 30, under the influence of which charge, in this case electrons, is transported from the read-in zone 25 to the clock electrode 28. When clock voltages $\phi_{28}$, $\phi_{29}$ etc. are supplied to the clock electrodes 28, 29 etc., the voltage is transported by the charge transfer device to the read-out zone 9. In a particular preferred embodiment, there are provided the input capacitor 30, a dielectric layer 33 on the semiconductor body 1 and conductive layer 34 on the dielectric layer 33 and the dielectric layer 33 of the input capacitor 30 has substantially the same structure as the dielectric layer 13 of the feedback capacitor 11. For the amplification factor $\alpha$ of the charge transfer device it holds in general:

$$\alpha = V_{out}/V_{in} \sim C_{in}/C_t = \delta_{in} \cdot 0_{in} \cdot d_t / \delta_t \cdot 0_t \cdot d_{in}$$

where $C_{in}$, $0_{in}$, $C_t$ and $0_t$ represent the capacitance and the surface area of the input capacitor 30 and the feedback capacitor 11, respectively, and $\delta_{in}$, $d_{in}$, $\delta_t$ and $d_t$ represent the dielectric constant and the thickness of the dielectric layer 33 and of the dielectric layer 13, respectively, of the input capacitor 30 and of the feedback capacitor 11, respectively. Due to the fact that the two dielectric layers 13, 33 have practically the same structure, the capacitive properties, that is to say the thickness and the dielectric constant, of the two layers 13, 33 are also equal. Consequently, these quantities fall out of the equation for the amplification factor so that the latter can be simplified to:

$$\alpha \sim 0_{in}/0_t.$$

The amplification factor consequently only depends upon the ratio between the surface area of the input capacitor 30 and that of the feedback capacitor 11. When a suitable value is chosen for both surface areas, the amplification factor can thus be adjusted in a simple and accurate manner. Moreover, this factor is very reproducible now that the specific common structure of the dielectric layers 13, 33 is no longer of importance.

Preferably, the charge transfer device is constructed so that the input capacitor 30 has practically the same capacitance as the feedback capacitor 11. This is the case, for example, if the input capacitor 30 has practically the same configuration as the feedback capacitor 11. In this case, the output signal $V_{out}$ measured at the output 16 is practically an exact reproduction of the input signal $V_{in}$ supplied to the input capacitor 30.

It will be appreciated that within the scope of the invention many further variations are possible for those skilled in the art so that many other semiconductor devices may be realized by means of the invention. For example, in general in the embodiments described the conductivity types may be replaced (all simultaneously) by the opposite conductivity types.

What is claimed is:

1. A semiconductor device comprising a semiconductor body which is provided at a surface with a charge transfer device having an output stage which comprises a read-out zone located at the surface and an amplifier having a feedback capacitor, an inverting input of the amplifier being connected to the read-out zone and an output of the amplifier being fed back via the capacitor to the input, characterized in that the capacitor comprises a surface region in the semiconductor body, a dielectric layer on the surface and an electrically conducting layer on the dielectric layer, in that the surface region is connected to the read-out zone and in that means are provided by which during operation of the charge transfer device the surface potential of the surface region of the feedback capacitor is solely determined by the potential of the read-out zone.

2. A semiconductor device as claimed in claim 1, characterized in that the feedback capacitor is a capacitor of the depletion type.

3. A semiconductor device as claimed in claim 2, characterized in that the feedback capacitor has in the surface region at the surface a doped zone of a conductivity type opposite to a conductivity type of the surface region.

4. A semiconductor device as claimed in claim 3, characterized in that the doped zone adjoins the read-out zone.

5. A semiconductor device as claimed in claim 1, 2, 3 or 4, characterized in that the amplifier comprises a field effect transistor, of which a drain zone constitutes the output of the amplifiers and is coupled to a load and of which a gate electrode is the inverting input of the amplifier and in that a reset transistor is arranged between the read-out zone and the output of the amplifier.

6. A semiconductor device as claimed in claim 5, characterized in that the load is a field effect transistor of the depletion type.

7. A semiconductor device as claimed in claim 1, 2, 3 or 4, characterized in that the charge transfer device is provided with an input stage having an input capacitor, which comprises a dielectric layer on the semiconductor body and a conductive layer on the dielectric layer, and in that the dielectric layer of the input capacitor has at least substantially the same structure as the dielectric layer of the feedback capacitor.

8. A semiconductor device as claimed in claim 1, 2, 3 or 4, characterized in that the charge transfer device is provided with an input stage having an input capacitor and in that the feedback capacitor has at least substantially the same capacitance as the input capacitor.

* * * * *